United States Patent [19]

Yamamoto et al.

[11] Patent Number: 4,951,293
[45] Date of Patent: Aug. 21, 1990

[54] FREQUENCY DOUBLED LASER APPARATUS

[75] Inventors: Kazuhisa Yamamoto, Osaka; Tetsuo Taniuchi, Kobe, both of Japan

[73] Assignee: Matsushita Electric Industrial Co., Ltd, Osaka, Japan

[21] Appl. No.: 354,324

[22] Filed: May 19, 1989

[30] Foreign Application Priority Data

May 26, 1988 [JP] Japan ................................ 63-128914
Oct. 11, 1988 [JP] Japan ................................ 63-255120

[51] Int. Cl.$^5$ ............................ H01S 3/19; H03F 7/00
[52] U.S. Cl. ........................................ 372/50; 372/21; 372/22; 307/427; 307/430
[58] Field of Search ...................... 372/21, 22, 50, 92; 307/427, 430

[56] References Cited

U.S. PATENT DOCUMENTS 4,803,692 2/1989 Sakano et al. ..................... 372/50

OTHER PUBLICATIONS

"Miniaturized Light Source of Coherent Blue Radiation", by T. Taniuchi et al.; Cleo 87, WP6, 1987, Apr.
"Second Harmonic Generation By Cherenkov Radiation In Proton-Exchanged LiNbO$_3$ Optical Waveguide", by T. Taniuchi et al.; Cleo '86, WR3, 1986, Apr.
"Proton Exchange for High-Index Waveguides in LiNbO$_3$", by J. L. Jackel et al. Appl. Phys. Lett 41, No. 7, Oct. 1, 1982; pp. 607 & 608.

Primary Examiner—William L. Sikes
Assistant Examiner—Georgia Y. Epps
Attorney, Agent, or Firm—Pollock, Vandesande, & Priddy

[57] ABSTRACT

A visible laser source comprises a sub mount. A semiconductor laser located on the sub mount has an active layer formed at a surface of the semiconductor laser. The active-layer formed surface of the semiconductor laser opposes the sub mount. An optical nonlinear device located on the sub mount has a waveguide formed at a surface of the optical nonlinear device. The waveguide formed surface of the optical nonlinear device opposes the sub mount. The semiconductor laser and the waveguide are directly coupled to each other for direct application of a fundamental wave from the semiconductor laser to the optical nonlinear device.

17 Claims, 5 Drawing Sheets

FREQUENCY DOUBLED LASER APPARATUS

BACKGROUND OF THE INVENTION

This invention relates to a visible laser source.

"Miniaturized light source of coherent blue radiation" by T. Taniuchi and K. Yamamoto, CLEO '87, WP6, 1987 discloses a visible laser source, which has some problems as described hereinafter.

SUMMARY OF THE INVENTION

It is an object of this invention to provide an excellent visible laser source.

A visible laser source of this invention comprises a sub mount. A semiconductor laser located on the sub mount has an active layer formed at a surface of the semiconductor laser. The active-layer formed surface of the semiconductor laser opposes the sub mount. An optical nonlinear device located on the sub mount has a waveguide formed at a surface of the optical nonlinear device. The waveguide formed surface of the optical nonlinear device opposes the sub mount. The semiconductor laser and the waveguide are directly coupled to each other for direct application of fundamental wave from the semiconductor laser to the optical nonlinear device.

BRIEF DESCRIPTION OF THE DRAWINGS

Like and corresponding elements are denoted by the same reference characters throughout the drawings.

DESCRIPTION OF THE PREFERRED EMBODIMENTS

Figure 1:
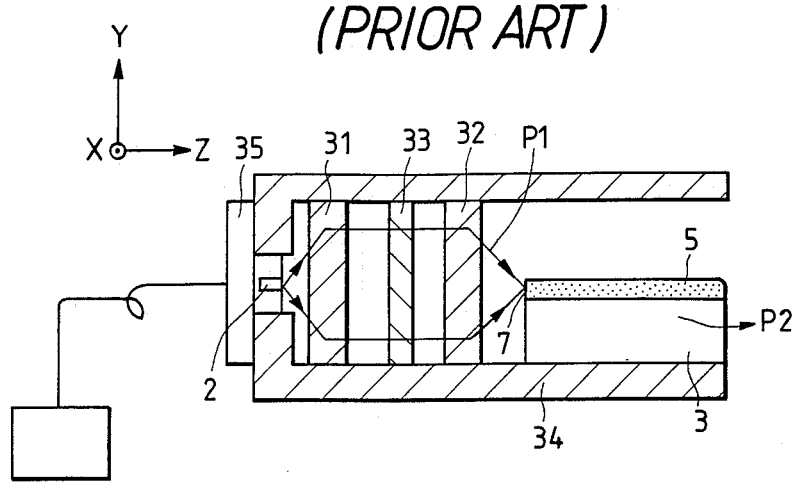
FIG. 1 is a sectional view of a prior art visible laser source.

Before the description of this invention, a prior art visible laser source will be described hereinafter for a better understanding of this invention. FIG. 1 shows a prior art visible laser source disclosed in "Miniaturized light source of coherent blue radiation" by T. Taniuchi and K. Yamamoto, CLEO '87, WP6, 1987.

As shown in FIG. 1, the prior art visible laser source includes a semiconductor laser 2, an optical nonlinear device 3, lenses 31 and 32, and a half wave plate 33. Fundamental wave P1 from the semiconductor laser 2 is applied via the lenses 31 and 32 to a light incoming surface 7 (a light incident surface) of a waveguide 5 formed in the optical nonlinear device 3. The half wave plate 33 extends between the lenses 31 and 32. The half wave plate 33 rotates fundamental wave P1 through 90° in a direction of polarization to match the direction of polarization to polarization characteristics of the waveguide 5 to allow the fundamental wave P1 to be guided along the waveguide 5.

Figure 2:
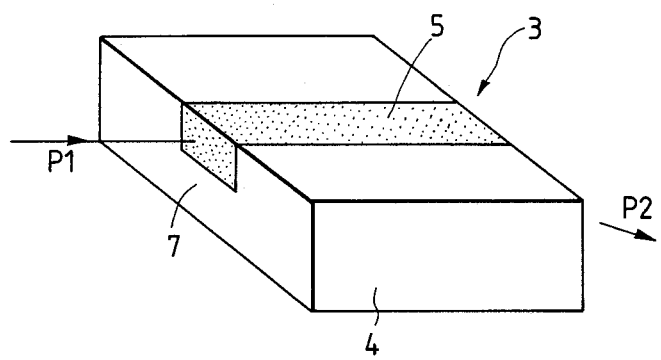
FIG. 2 is a perspective view of the optical nonlinear device of FIG. 1.
Figure 3:
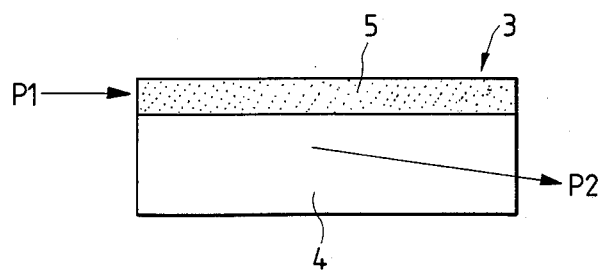
FIG. 3 is a sectional view of the optical nonlinear device of FIG. 1.

FIGS. 2 and 3 show the prior art optical nonlinear device 3 which is disclosed in "Second harmonic generation by Cherenkov radiation in proton-exchanged LiNbO$_3$ optical waveguide" by T. Taniuchi and K. Yamamoto, CLEO '86, WR3, 1986.

As shown in FIGS. 2 and 3, the prior art optical nonlinear device 3 includes a LiNbO$_3$ substrate 4 on which the buried-type waveguide 5 is formed. In cases where the fundamental wave P1 is applied to the light incoming surface 7 of the waveguide 5, when the effective refractive index N1 related to the guide mode of the fundamental wave P1 equals the effective refractive index N2 related to hormonic wave P2, the harmonic wave P2 is effectively radiated into the substrate 4 via the waveguide 5 so that a desired optical nonlinear function is available.

A method of forming such a prior art buried-type waveguide 5 is disclosed in "Proton exchange for high-index waveguides in LiNbO$_3$" by J. L. Jackel, C. E. Rice, and J. J. Veselka, Appl. Phys. Lett., Vol 41, No. 7, pp 607–608, 1982. In this prior art method, a layer of Cr or Al is formed on a ferroelectric LiNbO$_3$ substrate 4 by vapor deposition, and a photo process and an etching process are used to provide a slit in the substrate 4. The slit has a width of about several micrometers. Then, the substrate 4 is thermally processed in benzoic acid to form a high refractive index layer corresponding to a waveguide 5. The refractive index difference between the high refractive index layer and the main body of the substrate 4 is about 0.13.

During the assembly of the prior art visible laser source of FIG. 1, the lenses 31 and 32, the half wave plate 33, and the optical nonlinear device 3 are fixedly located on a mount 34. After the alignment is made on a package 35 of the semiconductor laser 2 in directions of three axes X, Y, and Z with an accuracy of 1 micrometer, the package 35 is fixed to a position at which the intensity of the obtained harmonic wave is maximized.

The total length of the prior art visible laser source of FIG. 1 is 30 mm under conditions where the semiconductor laser 2 emits light having a wavelength of 0.84 micrometer and the length of the optical nonlinear device 3 is 6 mm. It was experimentally found that when the power output of the fundamental wave P1 from the semiconductor laser 2 was 120 mW, the portion of the output fundamental wave P1 which corresponds to 65 mW was coupled to the optical nonlinear device 3 and the harmonic wave P2 of 1.05 mW was obtained. In this case, the conversion efficiency (P1/P2) in the optical nonlinear device 3 was 0.9% and the coupling efficiency was 54%.

The prior art visible laser source of FIG. 1 has problems as follows. The alignment of the optical axes of the lenses and the optical nonlinear device tends to be difficult since an accuracy of 1 micrometer or less is required in this alignment. The number of necessary parts is large. The large number of the parts tends to cause a mis-alignment of the optical axes. Furthermore, the large number of the parts causes the visible laser source to be easily affected by a temperature variation and a vibration. The lenses produce a considerable loss of the fundamental wave. The lenses are large so that the visible laser source is also large. It is generally difficult to stably generate a harmonic wave of 1 mW or greater.

Figure 4:
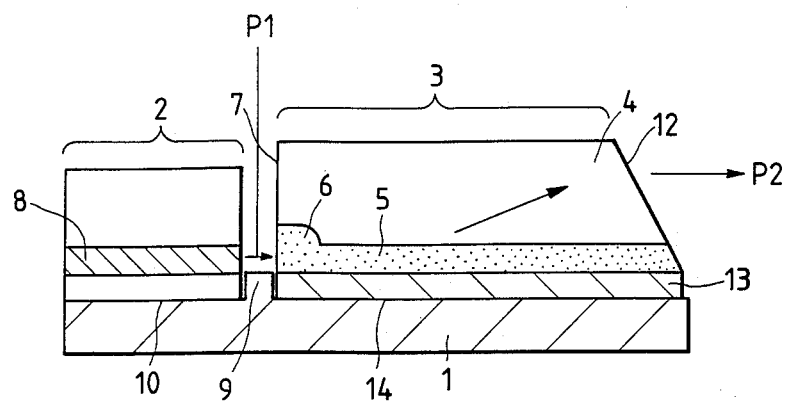
FIG. 4 is a sectional view of a visible laser source according to a first embodiment of this invention.

FIG. 4 shows a visible laser source according to a first embodiment of this invention. As shown in FIG. 4, the visible laser source includes a sub mount 1 of Si on which a semiconductor laser 2 and an optical nonlinear device 3 are located. The semiconductor laser 2 emits light having a wavelength of 0.84 micrometer. The power output of the semiconductor laser 2 is 100 mW. The optical nonlinear device 3 includes a $LiNbO_3$ substrate 4. A waveguide 5 is formed on the substrate 4 by proton exchange performed within phosphoric acid. The waveguide 5 has a large variation in refractive index and effectively traps the light. In addition, the waveguide 5 has a high efficiency of the conversion of fundamental wave into harmonic wave. An active layer 8 of the semiconductor layer 2 is formed at the surface 10 of the semiconductor laser 2 which opposes the sub mount 1. The waveguide 5 is formed at the surface 14 of the optical nonlinear device 3 which opposes the sub mount 1. The active layer 8 of the semiconductor laser 2 and the waveguide 5 have a common optical axis so that the semiconductor laser 2 and the waveguide 5 are directly coupled with respect to fundamental wave P1.

When the fundamental wave P1 which has a wavelength of 0.84 micrometer is directly applied from the semiconductor laser 2 into the waveguide 5 via a light incoming surface 7 (a light incident surface) of the optical nonlinear device 3, the fundamental wave P1 propagates in a single mode and is converted within the waveguide 5 into harmonic wave P2 having a wavelength of 0.42 micrometer. The harmonic wave P2 is emitted from a light outgoing surface 12 of the optical nonlinear device 3.

Figure 5A:
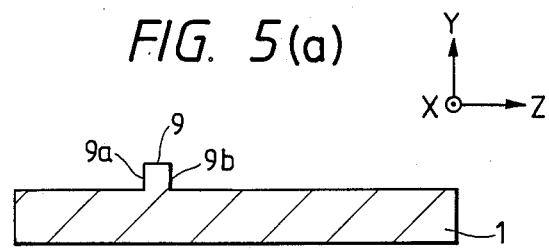
FIGS. 5(a), 5(b), and 5(c) are sectional views of the visible laser source of the first embodiment during the assembly thereof.
Figure 5B:
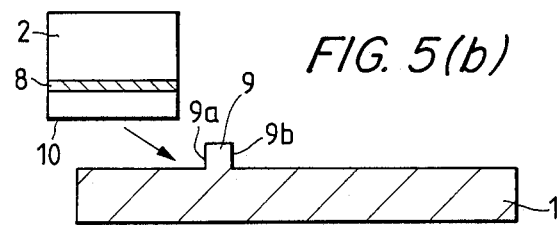
Figure 5C:
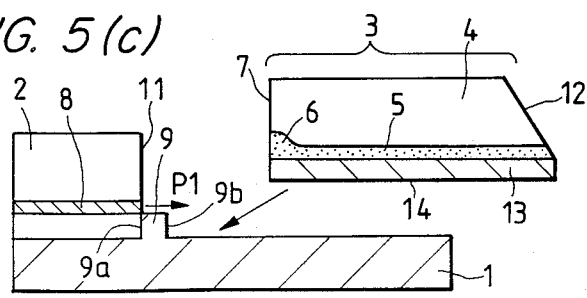
Figure 6:
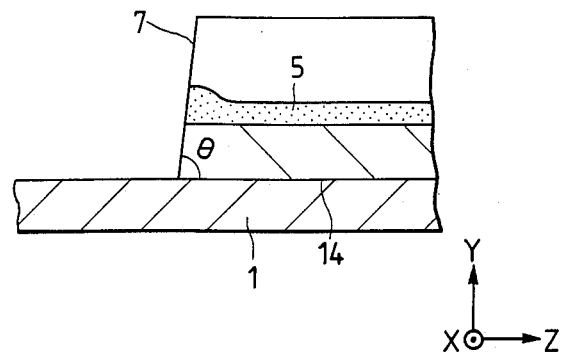
FIG. 6 is a sectional view of portions of the optical nonlinear device and the sub mount of FIG. 4.

The visible laser source of FIG. 4 was manufactured as follows. As shown in FIG. 5(a), the sub mount 1 of Si had a flat surface extending parallel to directions X and Z. A projection 9 extending along a direction Y was formed on the sub mount 1 by a known photo process and a known dry etching process. It should be noted that the directions X, Y, and Z are perpendicular to each other. The projection 9 had a width of 2 micrometers and a height of 5 micrometers. Subsequently, as shown in FIG. 5(b), the semiconductor laser 2 was bonded to the flat region of the sub mount 1 which extends leftward of the projection 9 as viewed in FIG. 5(b). Specifically, the surface 10 of the semiconductor laser 2 at which the active layer 8 was formed was opposed to the sub mount 1. During the bonding of the semiconductor laser 2, a light outgoing (output) end face of the semiconductor laser 2 was pressed against a left-hand side 9a of the projection 9. Subsequently, as shown in FIG. 5(c), the optical nonlinear device 3 was fixed to the sub mount 1 after a drive electric current was passed through the semiconductor laser 2 to generate the fundamental wave P1. Specifically, the optical nonlinear device 3 was located on the flat region of the sub mount 1 which extended rightward of the projection 9. In addition, the surface 14 of the optical nonlinear device 3 at which the waveguide 5 was formed was opposed to the sub mount 1. During the fixing of the optical nonlinear device 3, a light incoming (input) end face of the optical nonlinear device 3 was pressed against a right-hand side 9b of the projection 9. As shown in FIG. 6, the light incoming surface 7 of the optical nonlinear device 3 formed an angle $\theta$ of 90° or less with respect to the surface 14 of the optical nonlinear device 3 at which the waveguide 5 was formed. This angular design of the light incoming surface 7 of the optical nonlinear device 3 prevents mechanical contact between the semiconductor laser 2 and the optical nonlinear device 3 which could damage the devices 2 and 3. In addition, this angular design of the light incoming surface 7 allows a smaller portion of the light to be reflected at the light incoming surface 7 back to the active layer 8 of the semiconductor laser 2. When the optical nonlinear device 3 was fixed to the sub mount 1, the optical nonlinear device 3 was aligned with the semiconductor laser 2 in the direction X so that the power of the generated harmonic wave P2 was maximized. Since the projection 9 separates the semiconductor laser 2 and the optical nonlinear device 3 from each other by a gap of 2 micrometers in the direction Z, a positive process of aligning the devices 2 and 3 in the direction Z is unnecessary. During the bonding of the semiconductor laser 2 and the fixing of the optical nonlinear device 3, since the devices 2 and 3 are placed on the flat surfaces of the sub mount 1 having the same level and since the active layer 8 of the device 2 and the waveguide 5 of the device 3 are in the same height, a positive process of aligning the devices 2 and 3 in the direction Y is unnecessary. Specifically, a protective layer 13 of $SiO_2$ covering the waveguide 5 was formed on the optical nonlinear device 3 to equalize the heights of the active layer 8 of the device 2 and the waveguide 5 of the device 3. The height of the waveguide 5 which was measured from the surface of the sub mount 1 was 6.5 micrometers. A light incoming end of the waveguide 5 was heated to form a taper waveguide 6. The thickness of the taper waveguide 6 was greater than the thickness of the remainder of the waveguide 5. The taper waveguide 6 ensures a higher coupling efficiency with respect to the fundamental wave P1 and allows easier matching between the heights of the active layer 8 of the device 2 and the waveguide 5 of the device 3.

When the semiconductor laser 2 was operated at a power output of 100 mW, the power of the obtained harmonic wave P2 (whose wavelength is 0.42 micrometer) was 2 mW. In this case, the conversion efficiency was 2%. In this way, the conversion efficiency in this embodiment was higher than the conversion efficiency in the prior art visible laser source of FIG. 1. The higher conversion efficiency results from the following fact. The coupling efficiency in this embodiment is greater than that in the prior art visible laser source of FIG. 1 by a factor of 1.5 so that 76% of the output fundamental wave from the semiconductor laser 2 enters the optical nonlinear device 3. Specifically, an antireflection film of $SiO_2$ was formed on the light incoming surface 7 of the optical nonlinear device 3. The antireflection film causes a 15% increase in the efficiency of the coupling between the active layer 8 of the semiconductor laser 2 and the waveguide 5 of the optical nonlinear device 3 with respect to the fundamental wave P1. In addition, the antireflection film decreases the quantity of the return of the fundamental wave P1 to the semiconductor laser 2 which could cause unstable operation of the device 2.

The visible laser source of this embodiment is smaller than the prior art visible laser source of FIG. 1. Specifically, the visible laser source of this embodiment is 4×4×10 mm in size. In the visible laser source of this embodiment, a mis-alignment between the optical axes remains effectively prevented. Therefore, the visible laser source of this embodiment is less affected by a temperature variation and a vibration than the prior art visible laser source of FIG. 1.

The light outgoing surface 12 of the optical nonlinear device 3 is polished and is vertical (perpendicular) with respect to the direction of the travel of the harmonic wave P2. This design allows a smaller variation in the outgoing angle of the harmonic wave P2 due to a temperature variation.

It should be noted that the sub mount 1 may be made of material other than Si. In cases where the sub mount 1 is made of MgO-doped material, it is possible to prevent an optical damage by short wave light and thus to prevent a variation in the power of the generated harmonic wave.

It was experimentally confirmed that the visible laser source of this embodiment generated a harmonic wave with respect to a fundamental wave whose wavelength was in the range of 0.65–1.3 micrometers.

Figure 7:
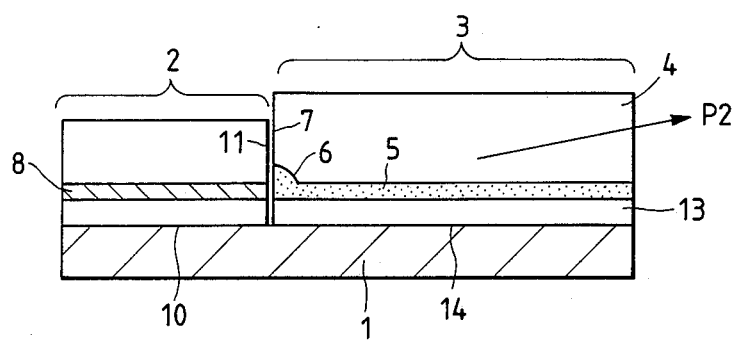
FIG. 7 is a sectional view of a visible laser source according to a second embodiment of this invention.
Figure 8:
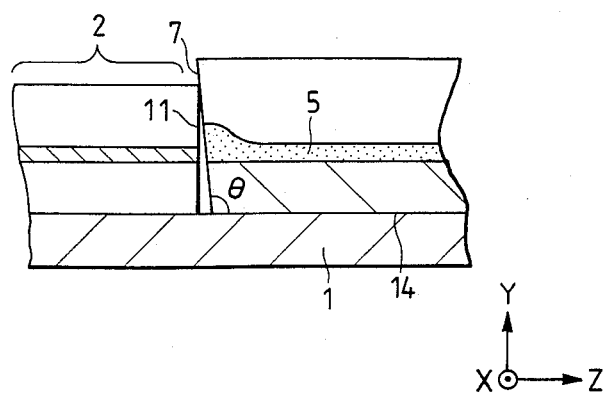
FIG. 8 is a sectional view of portions of the semiconductor laser, the optical nonlinear device, and the sub mount of FIG. 7.

FIGS. 7 and 8 show a second embodiment of this invention which is similar to the embodiment of FIGS. 4–6 except for the design changes indicated hereinafter.

In the embodiment of FIGS. 7 and 8, a projection 9 (see FIG. 4) is removed from a sub mount 1. A light outgoing surface 11 of a semiconductor laser 2 contacts a light incoming surface 7 of an optical nonlinear device 3.

The embodiment of FIGS. 7 and 8 was assembled as follows. After the optical nonlinear device 3 was bonded to the sub mount 1, the semiconductor laser 2 was bonded to the sub mount 1 while being pressed against the optical nonlinear device 3. As shown in FIG. 8, the light incoming surface 7 of the optical nonlinear device 3 formed an angle $\theta$ of 90° or greater with respect to a surface 14 of the optical nonlinear device 3 at which waveguides 5 were formed. During the bonding of the semiconductor laser 2, the light outgoing surface 11 of the semiconductor laser 2 was pressed against the light incoming surface 7 of the optical nonlinear device 3 so that the semiconductor laser 2 was correctly located in a direction Z. The length of the manufactured visible laser source was 6 mm.

Figure 9:
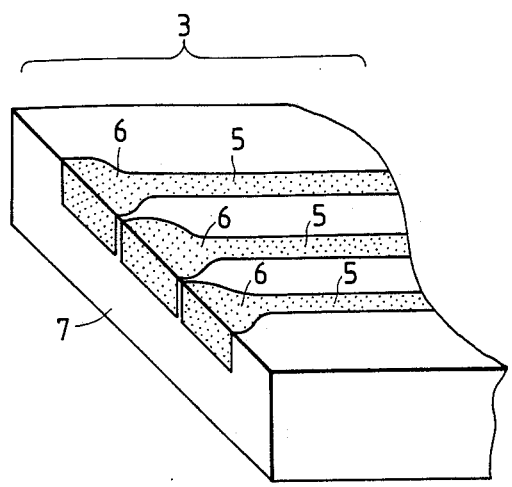
FIG. 9 is a perspective view of the optical nonlinear device of FIG. 7.

As shown in FIG. 9, the optical nonlinear device 3 has a plurality of parallel waveguiudes 5 extending along the direction Z. Light incoming ends of the respective waveguides 5 form taper waveguides 6. At the light incoming surface 7 of the optical nonlinear device 3, the taper waveguides 6 align along a direction X. A strip region of the light incoming surface 74 which extends along the direction X is substantially continuously occupied by the taper waveguides 6. This design ensures reliable coupling between an active layer 8 of the semiconductor laser 2 and at least one of the waveguides 5.

It was experimentally found that visible laser sources of the embodiment of FIGS. 7–9 were manufactured at a yield of 30% without any positive alignment.

Figure 10A:
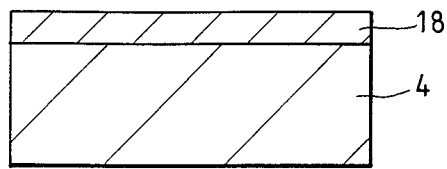
FIGS. 10(a), 10(b), 10(c), and 10(d) are sectional views of the optical nonlinear device of the second embodiment during the fabrication thereof.
Figure 10B:
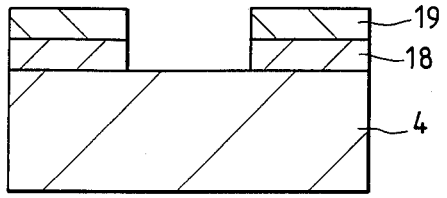
Figure 10C:
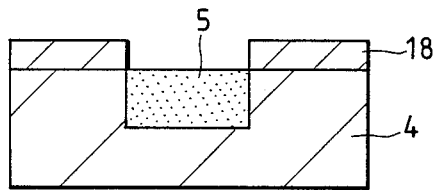
Figure 10D:
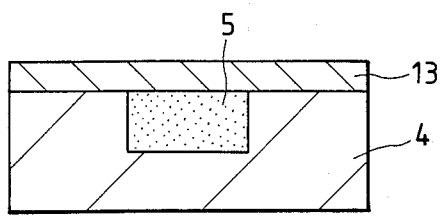

The optical nonlinear device 3 in the embodiment of FIGS. 7–9 was fabricated as follows. A substrate 4 included a +X plate (a "+" side of a substrate cut along a plane perpendicular to a direction X) of MgO-doped LiNbO$_3$. The X plate was used to match the directions of polarization of the semiconductor laser 2 and the waveguides 5. As shown in FIG. 10(a), one surface of the substrate 4 was coated with a protective mask 18 of Ta by electron beam vapor deposition. The thickness of the mask 18 was 300 angstroms. As shown in FIG. 10(b), a pattern of photo resist 19 was formed on the protective mask 18 by a general photo process. The thickness of the photo resist 19 was 0.5 micrometer. Then, the protective mask 18 was exposed to dry etching using CF$_4$. After the photo resist 19 was removed from the substrate 4, the substrate 4 with the protective mask 18 was exposed to a heating process or a proton exchange process within phyrophosphoric acid to form a waveguide 5 as shown in FIG. 10(c). Specifically, the substrate 4 was heated to 230° C. and remained heated at 230° C. for 8 minutes. The thickness of the waveguide 5 was 0.37 micrometer. It should be noted that, for clarity, FIGS. 10(b) and 10(c) show a case where a single waveguide is formed. After the formation of the waveguide 5, the protective mask 18 was removed from the substrate 4. Then, a light incoming portion of the substrate 4 was thermally processed at a temperature of 300° C. so that the thickness of the waveguide 5 at the light incoming portion was 1.5 micrometer. As shown in FIG. 10(d), the substrate 4 and the waveguide 5 were coated with a protective layer of SiO$_2$. Opposite surfaces of the substrate 4 which extended substantially perpendicular to the waveguide 5 were polished to form a light incoming surface 7 (see FIGS. 7-9) and a light outgoing surface 12. Subsequently, the edge of the light outgoing surface 12 through which a fundamental wave passes was made rough to scatter the fundamental wave. The light incoming surface 7 was coated with an antireflection film acting on the fundamental wave. The antireflection film on the light incoming surface 7 serves to prevent the return of the fundamental wave to the semiconductor laser 2. The light outgoing surface 12 was coated with an antireflection film acting on harmonic wave. The antireflection film on the light outgoing surface 12 ensures that the harmonic wave is effectively outputted via the light outgoing surface 12.

When the fundamental wave P1 which has a wavelength of 0.84 micrometer is applied from the semiconductor laser 2 to the waveguide 5 via the light incoming surface 7 of the optical nonlinear device 3, the fundamental wave P1 propagates in a single mode and is converted within the waveguide 5 into harmonic wave P2 having a wavelength of 0.42 micrometer. The harmonic wave P2 is emitted from the light outgoing surface 12 of the optical nonlinear device 3.

It was experimentally found that when the power output of the fundamental wave P1 from the semiconductor laser 2 was 70 mW, the harmonic wave P2 of 1 mW was obtained. In addition, since the portion of the fundamental wave which returned to the semiconductor laser 2 was greatly decreased, the semiconductor laser 2 operated stably and the power output of the harmonic wave fluctuated in the range of ±3%.

Figure 11:
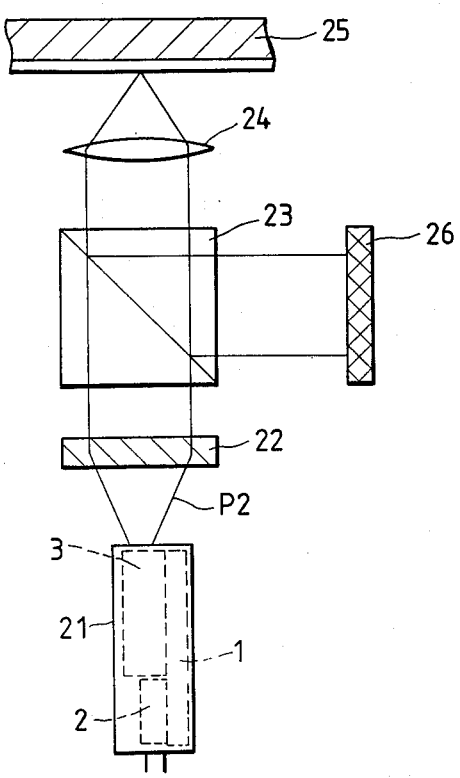
FIG. 11 is a sectional view of an optical information recording and reproducing system which includes a visible laser source of this invention.

FIG. 11 shows an optical information recording and reproducing system which includes a visible laser source 21 similar to the visible laser source of FIGS. 4–6. The visible laser source 21 is used in a reproducing section of the system.

As shown in FIG. 11, the visible laser source 21 includes a sub mount 1 on which a semiconductor laser 2 and an optical nonlinear device 3 are fixedly located. Fundamental wave P1 emitted from the semiconductor laser 2 is converted by the optical nonlinear device 3 into harmonic wave P2. A beam of the harmonic wave P2 outputted from the visible laser source 21 is shaped by a lens 22 into parallel light. The parallel harmonic wave P2 passes through a beam splitter 23 and is then focused by a lens 24 into a spot on an optical disk 25. The diameter of the light spot is 0.62 micrometer which equals approximately a half of the diameter of a light spot available in a prior art system. The smaller diameter of the light spot enables a larger recording density related to the optical disk 25. The harmonic wave P2 is reflected by the optical disk 25 and carries information recorded on the optical disk 25. Then, the reflected harmonic wave P2 enters the beam splitter 23. After the harmonic wave P2 is reflected by the beam splitter 23, the wave P2 enters an optical detector 26 which generates an electric signal representative of the information.

In the embodiments of this invention, light absorbing material may be applied to the light outgoing surface 12 of the optical nonlinear device 3 to absorb the fundamental wave. In addition, the substrate 4 of the optical nonlinear device 3 may be made of ferroelectric material such as $LiTaO_3$ or $KNbO_3$, organic material such as MNA, or a compound semiconductor such as ZnS.

What is claimed is:

1. A laser source comprising:
    a sub mount;
    a semiconductor laser located on the sub mount and having an active layer formed at a surface thereof facing the sub mount;
    an optical nonlinear device located on the sub mount and having a waveguide formed at a surface thereof facing the sub mount;
    wherein the semiconductor laser and the waveguide are directly coupled to each other such that a fundamental wave from the semiconductor laser can be directly applied to the optical nonlinear device.

2. The laser source of claim 1 wherein the active layer of the semiconductor laser and the waveguide of the optical nonlinear device have a common optical axis.

3. The laser source of claim 1 wherein the sub mount has a projection extending between the semiconductor laser and the optical nonlinear device.

4. The laser source of claim 1 wherein the sub mount is made of Si.

5. The laser source of claim 1 wherein the optical nonlinear device includes a substrate of $LiNb_xTa_{1-x}O_3$, where the character X denotes a value between 0 to 1.

6. The laser source of claim 1 wherein the optical nonlinear device includes a substrate of MgO-doped $LiNb_xTa_{1-x}O_3$, where the character X denotes a value between 0 and 1.

7. The laser source of claim 1 wherein the waveguide is a proton exchange waveguide.

8. The laser source of claim 1 further comprising a protective layer covering the waveguide.

9. The laser source of claim 1 wherein a light incoming end of the waveguide includes a taper waveguide.

10. The laser source of claim 1 wherein the optical nonlinear device has a light outgoing surface via which a harmonic wave travels from the optical nonlinear device, light outgoing surface being perpendicular to a direction of the travel of the harmonic wave from the optical nonlinear device.

11. The laser source of claim 1 further comprising surface means at a light outgoing end of the waveguide for scattering the fundamental wave from the semiconductor laser.

12. The laser source of claim 1 further comprising surface means at a light outgoing end of the waveguide for absorbing the fundamental wave from the semiconductor laser.

13. The laser source of claim 1 further comprising an antireflection film coated onto a light incoming surface of the optical nonlinear device.

14. The laser source of claim 1 wherein a light incoming surface of the optical nonlinear device forms an angle of 90° or less with respect to a surface of the sub mount on which the optical nonlinear device is located.

15. The laser source of claim 1 wherein the semiconductor laser further has a light outgoing surface and the optical nonlinear device further has a light incoming surface, the respective surfaces extending substantially orthogonally away from the sub mount along corresponding substantially parallel planes spaced from each other by a distance of 30 micrometer or less.

16. A laser source comprising:
    a semiconductor laser emitting a fundamental wave;
    an optical nonlinear device converting the fundamental wave into a corresponding harmonic wave; and
    means for directly applying the fundamental wave from the semiconductor laser to the optical nonlinear device.

17. The laser source of claim 16 further comprising a mount having a flat surface on which both of the semiconductor laser and the optical nonlinear device are located.

* * * * *